United States Patent [19]
Zampini et al.

[11] Patent Number: 5,789,522
[45] Date of Patent: Aug. 4, 1998

[54] RESIN PURIFICATION PROCESS

[75] Inventors: Anthony Zampini, Westborough; Suzanne M. Coley, Mansfield, both of Mass.

[73] Assignee: Shipley Company, L.L.C., Marlborough, Mass.

[21] Appl. No.: 709,340

[22] Filed: Sep. 6, 1996

[51] Int. Cl.$^6$ .................................................. C08G 8/04
[52] U.S. Cl. ........................ 528/129; 528/491; 528/499; 528/501; 427/352; 427/385.5; 430/113; 430/117; 430/135; 524/501; 524/594
[58] Field of Search ..................................... 528/129, 491, 528/499, 507; 427/352, 385.5; 436/113, 117, 135; 524/501, 594

[56] References Cited

U.S. PATENT DOCUMENTS 5,216,111  6/1993  Zampini .

FOREIGN PATENT DOCUMENTS

WO 93/12152  6/1993  WIPO .

OTHER PUBLICATIONS

Kirk Othmar Encyclopedia of Chemical Technology, 3rd Edition, vol. 17, pp. 384–413, 1982.

*Primary Examiner*—Duc Truong
*Attorney, Agent, or Firm*—Robert L. Goldberg

[57] ABSTRACT

The invention is directed to purification of phenolic resins and to a process for preparing an organic photoresist coating composition. The process comprises reacting one or more phenols to form a crude phenolic resin. The crude phenolic resin formed is then separated from its reaction mixture and dissolved in an aqueous insoluble organic solvent in an organic solvent that is a solvent for the photoresist coating composition. The solution so formed is then mixed with an aqueous phase to extract water soluble impurities from the resin solution into the aqueous phase. Finally, the purified resin solution is further diluted with additional photoresist solvent.

11 Claims, No Drawings

RESIN PURIFICATION PROCESS

BACKGROUND OF THE INVENTION

1. Introduction

This invention relates to the purification of novolak resins. More particularly, this invention relates to the removal of various ions from resins used in the manufacture of photoresists.

2. Description of the Prior Art

Phenolic resins such as novolak resins and polyvinyl phenol resins are known and used as binders in many coating compositions. A major use of such resins is in the formulation of photoresist compositions. Novolak resins are disclosed as photoresist binders generally in U.S. Pat. No. 4,404,272. Polyvinyl phenol resins is disclosed as photoresist binders in U.S. Pat. No. 3,869,292. The manufacture of both resins may be conducted in the presence of a strong acid during the polymerization reaction.

The formation of phenolic novolak resins by condensation of a phenol with an aldehyde is well known in the art and described in numerous publications including the *Kirk Othmer Encyclopedia of Chemical Technology*, Volume 15, pages 176 to 208, 1968, incorporated herein by reference. Phenol itself is the phenol used in the greatest volume for the formation of such phenolic resins, but resorcinol, alkyl substituted phenols such as cresols, xylenols, and p-tert-butylphenol and p-phenylphenol are used in substantial volume. In the past, the aldehyde used has been almost exclusively formaldehyde, but small amounts or acetaldehyde and furfuraldehyde have also been used. The condensation of a phenol with an aldehyde is typically an acid catalyzed reaction, often a hydrochloric acid catalyzed reaction, with a molar ratio of aldehyde to phenol less than 1.

Conventional novolak resins, prior to cure, have only moderate thermal stability and typically melt within a range of from about 90° C. to 120° C., dependent upon the composition of the resin and its molecular weight. There has been little effort to increase the stability of the thermoplastic novolak resins to high temperatures because high thermal stability had not been considered to be an important property of a film forming resin nor had it been considered important in the formation of photoresist films. However, recent developments created a need for novolak resins having a greater melt temperature than those of the conventional novolak resins.

An effort to increase thermal stability of the novolak resins comprised the acid condensation of a mixture of a naphthol and a phenol with an aldehyde as disclosed in U.S. Pat. No. 4,424,315. These resins are copolymers formed by the aforesaid acid condensation of an aldehyde with an aromatic alcohol mixture of a naphthol and a phenol in the presence of an acid catalyst. The molar ratio of the naphthol to the phenol can vary from about 20 to 1 to 1 to 20 dependent upon the desired properties of the resin. These resins were prepared for use as a binder for a photoresist and showed improved resistance to flow at elevated temperatures, though it was found that photoresists formulated with such resins were difficult to develop.

In *Materials for Microlithography*, L. F. Thompson, G. G. Wilson, and J. M. Frechet; Eds.; ACS Symposium Series 266, American Chemical Society, Washington, D.C., 1984, Chapter 17, page 339, an m-cresol-benzaldehyde novolak resin was formulated with a photosensitizer and solvent to produce positive tone images when the mixture was applied to a silicon wafer, exposed to actinic radiation and subsequently developed. However, the synthesis of the cresol-benzaldehyde novolak resin, as taught, produced a material having low molecular weight, and photoresist compositions using th is resin had low photospeed, low resolution and inadequate temperature resistance.

In U.S. Pat. No. 4,943,511, a positive photoresist composition is disclosed which uses a resin binder that is prepared from a phenolic component having a high p-cresol content and an aldehyde that is a mixture of formaldehyde and an aromatic aldehyde. In accordance with the patent, photoresists formulated using the aforesaid resins as binders possess improved resolution capabilities, but it is believed that the resins of the patent exhibit only minimal thermal improvement compared to prior art novolak resins.

U.S. Pat. No. 5,216,111 is directed to new resins comprising t he condensation product of a phenol and an aromatic aldehyde, mixtures of such resin with other phenolic resins including conventional novolak resins—i.e., those prepared by the reaction of a phenol with formaldehyde in the presence of an acid catalyst, and to a method for the formation of said aromatic novolak resins. T he resins disclosed in the patent exhibit glass transition temperatures in excess of 125° C. and many exhibit glass transition temperatures as high as 175° C. or higher. The resins are disclosed to be suitable for use in various coating compositions such as photoresist compositions and as precursors to heat resistant epoxy resins for use as laminate materials. Moreover, they are compatible with conventional novolak resins and other resins including other phenolic resins to provide new polymer mixtures exhibiting excellent film forming and thermal properties. Where the glass transition temperature of the resins disclosed and other resins used in combination with those of the invention are known, resin blends are readily prepared exhibiting any desired intermediate glass transition temperature by adjustment of the concentration of each resin in the blend.

An alternative approach to the formation of aromatic novolak resins is disclosed in U.S. Pat. No. 5,238,776 where the resin is the product resulting from the acid condensation of a bishydroxymethyl phenol with another phenol in the absence of an aldehyde. By the process of this patent, high molecular weight resins are formed having excellent thermal stability.

In each of the above process for the manufacture of phenolic resin, following the polymerization reaction, the phenolic resin is precipitated in water and removed from the reaction mixture by filtration. In the conventional process where a resin of high purity is required, such as in the manufacture of photoresists, the resin would then be dissolved in an organic solvent and passed through an ion exchange material to remove ionic contaminants. For example, it is known in the art that the acid condensation reaction used to form phenolic resins results in a resin containing acid residues. It is further known in the art that these acid residues are unacceptable contaminants in photoresists used for high resolution imaging such as in the fabrication of integrated circuit devices. Efforts to remove dissolved contaminants from materials used for the formation of photoresists by ion exchange are known in the art. For example, one such method is disclosed in International Publication No. WO 93/12152 which is directed to removing metal ions such as sodium and iron from novolak resins during their manufacture. The process comprises cation exchange treatment whereby a cation exchange resin is first washed with a mineral acid solution to reduce the level of total sodium and iron ions in the exchange resin to preferably less than 100 ppb, passing a formaldehyde reactant through the so treated cation exchange resin to decrease the sodium and iron ion content to less than 40 ppb, passing a phenolic compound through the cation exchange resin to decrease its sodium and iron ion content to less than 30 ppb, and then condensing the so treated phenolic compound with formaldehyde in the presence of an acid catalyst to form the resin.

A method for removal of dissolved ionic metals and non-metals from a photoresist is disclosed in Japanese Patent. Appln. No. 1228560, published Sep. 12, 1989. In accordance with the procedures of this patent, a photosensitive resin is passed through a mixed bed of strong cation exchange resin and an anion exchange resin to simultaneously remove cationic and anionic species from the photoresist solution.

Methods used to remove ionic contaminants in the prior art have not been completely satisfactory. For example, the use of strong acid ion exchange resins has been known to cause reaction of acid labile materials often found in photoresist products causing formation of undesirable impurities thus changing the concentration of the components in the photoresist composition. Moreover, the ion exchange materials used are costly and must be frequently replenished to remove exchanged contaminants. Finally, such materials often introduce acid into the material treated rather than remove the same.

SUMMARY OF THE INVENTION

The subject invention provides an alternative to ion exchange for removal of acid and other contaminants from the crude, freshly prepared phenolic resin. In accordance with the process, following formation of the resin in conventional manner, optionally including recovery by precipitation and filtration, a solution of the resin is formed in an essentially aqueous insoluble organic solvent and the solution so formed is subjected to liquid-liquid extraction with water. Unexpectedly, this process removes acid residues from the resin as well as many metallic ion contaminants to an extent sufficient to enable the resin to be used in applications requiring high purity such as for formation of photoresist products. Following at least one extraction, the organic and aqueous phases are allowed to separate and the aqueous phase removed.

In one embodiment of the invention, the aqueous insoluble organic solvent used in the extraction process is a solvent that is a component of the final photoresist composition whereby following extraction, the resin is further diluted with the same or different solvent to a concentration suitable for use in the formulation of a photoresist.

The process of the invention eliminates the ion exchange process and in the preferred embodiment, permits use of a solvent that is a photoresist component in the purification step. Liquid-liquid extraction is preferable to ion exchange because it is less costly and permits increased through-put.

DESCRIPTION OF THE PREFERRED EMBODIMENTS

The invention relates to the formation of phenolic resins and the purification of the same. In a preferred embodiment of the invention, the process is used for the formation of aromatic novolak resins and the purification of the same. For purposes of definition, the term "aromatic novolak resin" is used to refer to a novolak resin formed by condensing a phenolic monomer with a functional aromatic reactant capable of reacting with such phenol such as an aromatic aldehyde, a bis-hydroxymethylated phenol, or the combination of an aromatic aldehyde and a bis-hydroxy methylated phenol to form a novolak resin. The term also includes within its scope aromatic novolak resins further reacted with an additional aldehyde or a functional aromatic reactant alone or in combination with additional phenols to form alternating or block copolymers.

Formation of an aromatic novolak resin by reaction of a phenol with an aromatic aldehyde is disclosed in above referenced U.S. Pat. No. 5,216,111. In accordance with the procedure of that patent, the aromatic novolak resins are acid catalyzed condensation products of one or more phenols and an aromatic aldehyde formed by condensation of the reactants in the presence of a strong organic or mineral acid optionally in the presence of a divalent sulfur compound as a co-catalyst under reaction conditions set forth in the patent. The phenol is of the type conventionally used in the formation of novolak resins, such as, for example, phenol itself, the cresols, xylenols, resorcinols, naphthol, bisphenols such as 4,4'-isopropylidenediphenol and mixtures of such phenols. Preferred phenols include the cresols, m-cresol being most preferred because it yields a polymer having a narrow molecular weight distribution.

The aromatic novolak resin is desirably formed by condensation of the phenol with an aromatic aldehyde. The aromatic aldehyde is preferably one conforming to the following formula:

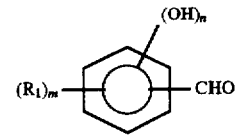

where $R_1$ is a member selected from the group consisting of halogen, cyano, nitro, carboxyl, alkoxy or alkyl having from 1 to 5 carbon atoms; m is a whole integer ranging between 0 and 2, and n is a whole integer ranging between 0 and 3. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chlorobenzaldehyde, 3-hydroxybenzaldehyde, 4-hydroxybenzaldehyde, 2-methoxybenzaldehyde, 3-nitrobenzaldehyde, etc. Mixtures of aromatic aldehydes may also be used. If desired, the aromatic aldehyde may be mixed with formaldehyde or a formaldehyde precursor such as paraformaldehyde. However, the aromatic aldehyde preferably is in molar excess of formaldehyde, more preferably comprises at least 90% by weight of the aldehyde mixture, and most preferably is the only aldehyde used to form the resin.

The aromatic novolak resins are formed by condensing the phenol with the aromatic aldehyde in the presence of acid. The molar concentration of the aromatic aldehyde may be slightly less than that of the phenol, but unexpectedly, may also be equivalent to or slightly in excess of the phenol without formation of a crosslinked resin. In this respect, the ratio of the phenol to the aromatic aldehyde may vary between about 1.1 to 1.0 and 1.0 to 1.1

Aromatic aldehydes, compared to formaldehyde, are less reactive towards condensation reactions, leading to formation of polymers of fewer repeating units. However, under more vigorous reaction conditions, aromatic aldehydes can condense with a reactive phenol in the presence of a strong mineral or organic acid such as hydrochloric acid, sulfuric acid, or toluene sulfonic acid to form resins having an increased number of repeating units. Thus, the condensation of the aromatic aldehyde with a reactive phenol may result in the formation of polymers having a weight average molecular weight in excess of 1200 Daltons, often in excess of 1,500 Daltons and if desired, in excess of 2500 Daltons, dependent upon the reaction conditions. Further, with respect to molecular weight, it has been found that the aromatic novolak resins have a narrower molecular weight distribution compared to novolak resins formed using formaldehyde as the condensation reactant. In addition, the resins have a glass transition temperature generally in excess of 125° C. and often in excess of 175° C.

The condensation of the aromatic aldehyde with the phenol is conducted by mixing the reactants and catalysts in a dehydrating non-interfering solvent in a reactor and refluxing the mixture at an elevated temperature for a period of time sufficient to form a polymer of at least the weight average molecular weight given above. The reactor may be any conventional condensation reactor equipped with an agitator, means for reflux and distillation, and conventional heat transfer means as required to perform the reaction. In general, a preferred method for carrying out the condensation reaction is to dissolve the aromatic aldehyde and the phenol in an appropriate dehydrating water miscible solvent, then add the acid catalyst and, if used, an ionizable divalent sulfur compound. The resultant mixture is agitated and heated to reflux over a period of time ranging from about 0.2 to 48 hours, during which time, the phenol and the aldehyde condense. The condensation reaction typically involves the initial formation of low molecular weight intermediates which then combine with each other at a later stage in the reaction to form higher molecular weight polymers.

Following reflux, excess water may be removed from the condensate and the condensate may then be subjected to distillation at a temperature of from 130° to 180° C. to complete the condensation reaction. Whether or not subjected to distillation and a higher temperature, the resin solution is typically diluted with more solvent and added to excess water to precipitate the resin. In the conventional process, the resin is then washed with water and dried at elevated temperature under vacuum. The resin will typically have a glass transition temperature of at least 125° C.

An alternative method for formation of the aromatic novolak resin comprises reaction of a reactive phenol with a bis-hydroxymethyl phenol in accordance with the procedures set forth in the above referenced U.S. Pat. No. 5,238,776. The procedure may be conducted in the absence of an aldehyde or in the presence of an aldehyde such as an aromatic aldehyde. In accordance with procedures given in the patent, bis-hydroxymethylated phenols that are particularly useful are represented by the following structures:

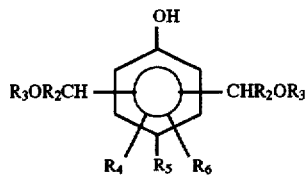

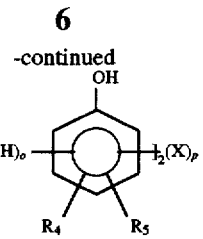

where in each formula as applicable, o is a whole integer equal to 1 or 2, p is an integer equal to 0 or 1; $R_2$ is hydrogen, an alkyl, an aryl, or a heterocyclic group, but preferably is H; $R_3$ is hydrogen, an alkyl or an acyl group, but preferably is hydrogen or methyl; $R_4$ and $R_6$ are individually hydrogen, halogen, an alkyl group, an alkoxy group having 1 to 4 carbon atoms, a phenoxy group, any aryl group or an arylalkyl group; and $R_5$ is the same as $R_4$ and $R_6$, and in addition a carboxylic group; and X is a bridging group which may be alkylene having 1 to 3 carbon atoms, —O—, —S—, —SO— or —SO$_2$—.

The bishydroxymethyl phenols may be formed by the reaction of formaldehyde with a phenol in the presence of a base. Suitable phenols include o-cresol, m-cresol, p-cresol, phenol, 2-phenylphenol, 3-phenylphenol, 4-phenylphenol, 2,3-dimethylphenol, 3,4-dimethylphenol, 3,5-dimethylphenol, 2,3,5-trimethylphenol, 3,4,5-trimethylphenol, p-ethylphenol, p-propylphenol, p-butylphenol, p-nonylphenol, p-tolylphenol, bromophenols, fluorophenols, chlorophenol, trimethylsilylphenol, chloromethylphenols, acylphenols, p-hydroxybenzoic acid, p-nitrophenol, bis(hydroxyphenyl)methane, isopropylidenebisphenol, biphenol, p-cresol formaldehyde dimers and trimers and the like, in the presence of a base. Suitable bases which will promote the reaction include sodium and potassium hydroxide and tetramethyl ammonium hydroxide.

The bishydroxymethyl groups of the above phenols are reactive and in the presence of heat and preferably a strong acid, react with each other or the ring of other reactive phenols to form alternating copolymers. Such phenols include phenol, cresols, dimethylphenols, trimethylphenols, naphthol, biphenols, phenylphenols, bisphenols, bis(hydroxyphenyl)methane, isopropylidenebisphenols, catechols, resorcinols, thiobiphenols, low molecular weight oligomers of phenols and the like, which contain at least two sites in the aromatic ring(s) of sufficient reactivity to undergo facile Friedel-Crafts reactions. The condensation reaction of the reactive phenol with the bishydroxymethylated phenol will sustain polymerization and result in the formation of alternating copolymers. To obtain the desired alternating copolymers, the reaction is conducted in the absence of an aldehyde. If an aldehyde is present in the reaction mixture during the formation of the alternating copolymer, than a polymer is formed that contains segments having both the alternating and random copolymer features. Such a polymer is substantially an alternating block copolymer. Other alternating block copolymer structures may be formed by first reacting the reactive phenol with an aldehyde to form a random structure and then introducing into the reaction mixture the bishydroxymethylated phenolic compound and reacting it with the reactive phenol and the random polymer structure. Alternatively, the bishydroxymethylated phenol is reacted first with the reactive phenol and then an aldehyde is added to the reaction mixture containing unreacted phenol to form the alternating block copolymer. Additional alternating block copolymer structures may be formed by reacting preformed alternating copolymers with preformed random copolymers with either or both an aldehyde and a bishydroxymethylated compound with or without the presence of a reactive phenol.

To prepare polymers having utility according to the invention, the reactants are dissolved in an appropriate non-reactive or non-interfering solvent and then catalyst is added. When desired, the same or additional reactants may be added at different stages of the polymerization process. When a volatile reactive phenolic is used in excess, it may also serve as a solvent or cosolvent. The condensation reaction leading to polymer formation can be carried out below, at, or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluenesulfonic acid and the like or acid cation exchange resins such as those having a sulfonic acid group. In certain cases, an inorganic catalyst may also be used. Such catalysts may include compounds of zinc, manganese, magnesium, aluminum, titanium, copper, nickel and cobalt. Upon completion of the condensation reaction, in the conventional process, the polymer would be recovered from its reaction mixture by precipitation into water which is a non-solvent for the polymer. The polymer would then be dried at elevated temperatures under reduced pressure. The resulting polymer may be either substantially an alternating copolymer or an alternating block copolymer structure.

To form a block copolymer, the aldehyde used includes any aldehyde containing the RCHO functionality, including without limitation, alkyl aldehydes and aromatic aldehydes. Preferred aldehydes include formaldehyde, benzaldehyde, salicylaldehyde, and mixtures thereof. An additional phenol may be included in the reaction mixture such as those identified above.

Two differing procedures may be used for formation of an alternating copolymer. The melt process comprises dissolution of the reactive phenol, the bishydroxymethylated phenol, water, solvent and catalyst in a resin reactor followed by gentle heating to about 60° C. to initiate the reaction. An exothermic condensation reaction ensues. After about 3 to 6 hours of reflux, the volatile components are removed by distillation at ambient pressure. When the temperature of the reaction mixture reaches about 220° C., vacuum is applied to remove the unreacted phenol. The resin melt is then poured into a tray and allowed to cool and solidify. In this reaction, the ratio of phenol to bishydroxymethylated phenol is typically 2:1 to about 1:0.9. The catalyst may be any of the acids identified above, the preferred being oxalic and hydrochloric. These are normally used within a range of from about 0.1 to 3.0 percent.

The solution process comprises dissolution of the reactive phenol, bishydroxymethylated phenol, solvent and catalyst in a resin reactor followed by gentle heating to reflux. The reaction temperature may vary from 68° to over 170° C. depending on the boiling point of the solvent, concentration of reactants, and catalyst in the solvent. Typical reaction times vary from 1 to 24 hours, usually around five hours. Suitable solvents for the reaction are the water miscible aprotic or protic type of materials. Some solvent examples are ethanol, diglyme, monomethylether of propylene glycol, propionic acid and dioxane. These solvents may be used alone or in combination. Total monomer concentration in the solvent or solvent mixture is usually in the 5 to 75% weight range relative to the solvent, preferably in the 10 to 30% range. Preferred catalysts are oxalic, hydrochloric and methanesulfonic acid. The effective catalyst concentration necessary to conduct the reaction will depend on the acid strength, temperature and reaction environment. Typical catalyst concentration may vary from 1 to 15% relative to the reactive phenol weight. In the conventional process, once the reaction is completed, the solution would be slowly added to a non-solvent for the polymer to cause precipitation. The product would then be collected and washed.

A typical process for forming the alternating block copolymer in which formaldehyde or other lower alkyl aldehyde is used comprises the following steps. The reactive phenol, bishydroxymethylated phenol, water, solvent and catalyst are added to a resin reactor and the mixture gently heated to about 70° C. to initiate the reaction forming the alternating copolymer. At about 100° C. the aldehyde is slowly added to the reaction mixture to form substantially phenol-methylene polymer segments and to chemically bond these segments to the previously formed alternating copolymer. After about 3 to 6 hours reflux, heat is applied to distill off the water and solvent. When the temperature of the reaction mixtures reaches about 210°–220° C., vacuum is applied to remove the unreacted phenol. The resin melt is then poured into a tray and allowed to cool and solidify. This reaction may also be conducted in solution as above. However, hydrochloric acid is not used when formaldehyde is present due to the formation of toxic byproducts.

The alternating copolymers and alternating block copolymers made with an aliphatic aldehyde are characterized by enhanced ortho-, ortho-coupling, weight average molecular weight of about 1500 to 5500 Daltons, polydispersity of 1.6 to 4, and a glass transition temperature of about 85° to 150° C.

The aromatic novolak resins as manufactured by the processes described above typically have a molecular weight of at least 1200 Daltons and more often, a molecular weight ranging between 1700 and 3000 Daltons; a glass transition temperature of at least 85° C. and typically from about 130° C. to 220° C.; a polydispersity (ratio of weight average molecular weight to number average molecular weight) of from 1.6 to 4.0; and a dissolution rate in a standard developer (polymer prior to esterification) of at least 200 Angstroms per second and more typically, from about 1200 to 3500 Angstroms per second.

The following examples will better illustrate the method for preparation of phenolic resins suitable for purification using procedures of the subject invention.

EXAMPLE 1

An m-Cresol—Salicylaldehyde Resin

A mixture of 183.2 grams salicylaldehyde, 162.2 grams m-cresol, 5.0 grams 3- mercaptopropionic acid, 1.5 grams of a 50 percent aqueous solution of p-toluenesulfonic acid and 200 ml of glacial acetic acid were charged into a 1-liter reaction vessel equipped with a paddle stirrer, reflux condenser and a nitrogen inlet tube. The mixture was heated to reflux and maintained at reflux for 16 hours. The reaction mixture was slowly poured into 7 liters of deionized water to precipitate the resin. Once the solvent had exchanged with water, the product was collected on a filter, slurried once in warm deionized water for about 30 minutes, again collected and rinsed with water.

EXAMPLE 2

An m-Cresol—Salicylaldehyde Resin [Additional Example]

A mixture of 184.1 grams of salicylaldehyde, 162.2 grams of m-cresol, 5.0 grams of 3- mercaptopropionic acid, 1.5 grams of p-toluenesulfonic acid and 200 ml of glacial acetic acid were charged into a 1-liter reactor vessel equipped with a paddle stirrer, reflux condenser and a nitrogen inlet tube. The mixture was heated to reflux and maintained at reflux for 7.5 hours. The reaction mixture was slowly added to a 7-liter flask of deionized water to precipitate the resin. Once the solvent had exchanged with water, the product was collected on a filter, slurried in warm deionized water for 30 minutes, again collected and rinsed with water.

EXAMPLE 3

An o-Cresol—Salicylaldehyde Resin

A mixture of 183.6 grams of salicylaldehyde, 162.2 grams of o-cresol, 3.0 grams of 3- mercaptopropionic acid, 1.1 grams of p-toluenesulfonic acid monohydrate and 75 ml of bis(2-methoxyethyl)ether were charged into a 1-liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 170° and 178° C. for two hours to complete the reaction. Upon cooling, the product mixture was diluted first with 150 ml of glacial acetic acid followed by 300 ml of methanol. The solution was slowly added to 3.2 liters of deionized water to precipitate the resin. Once the solvent had exchanged with water, the product was collected on a filter, slurried in warm deionized water and rinsed with water.

EXAMPLE 4

A p-Cresol—Salicylaldehyde Resin

A mixture of 183.2 grams of salicylaldehyde, 162.2 grams of p-cresol, 3.0 grams of 3- mercaptopropionic acid, 1.1 grams of p-toluenesulfonic acid monohydrate and 75 ml of bis(2- methoxyethyl) ether were charged into a 1-liter reactor vessel equipped with a paddle stirrer, reflux condenser and a nitrogen inlet tube. The reaction was carried out according to the procedure of Example 3.

EXAMPLE 5

An m-Cresol Salicylaldehyde—Benzaldehyde Resin

A mixture of 778.6 grams of m-cresol, 453.1 grams of benzaldehyde, 357.8 grams of salicylaldehyde, 14.5 grams of 3-mercaptopropionic acid, 9.6 grams of p-toluenesulfonic acid monohydrate and 650 ml of propionic acid were charged into a 4-liter reaction vessel equipped with a paddle stirrer, reflux condenser and a nitrogen inlet tube. The mixture was heated to reflux and maintained at reflux for 4 hours. The more volatile components in the reaction mixture were then removed by distillation at ambient pressure under a constant flow of nitrogen. The mixture temperature was then raised and maintained between 141° and 145° C. and allowed to reflux for 1 hour to complete the reaction. Upon dilution with 1.6 liters of propionic acid, the resin solution was precipitated into 14 liters of deionized water. The product was collected on a filter, slurried in 14 liters of deionized water, collected by filtration and rinsed with deionized water.

EXAMPLE 6

An m-Cresol—Salicylaldehyde—Benzaldehyde Resin

An Alternative Procedure

A mixture of 194.8 grams of m-cresol, 113.4 grams of benzaldehyde, 89.5 grams of salicylaldehyde, 1.0 liters of ethanol and 0.15 liters of concentrated hydrochloric acid were charged into a 2 liter 3-necked round bottom flask equipped with a mechanical stirrer, heating mantle, reflux condenser and a nitrogen inlet tube. The mixture was heated to and kept at reflux for about 5 hours. The reaction mixture was transferred to an addition funnel and slowly added into 6 liters of deionized water to precipitate the product. After a 4-hour soak, the precipitate was collected on a Buckner funnel aided by reduced pressure. The product was rinsed, re-slurried into 6 liters of deionized water and after a 1-hour soak, was again collected on the Buckner filter and rinsed. A fraction of this resin was vacuum oven dried at a temperature of between 90° and 100° C. for analytical comparisons.

EXAMPLE 7

An m-Cresol—Salicylaldehyde—2,6-bis (hydroxymethyl)-p-Cresol Resin

A mixture of 146.0 grams m-cresol, 146.5 grams salicylaldehyde, 25.2 grams 2,6- bis(hydroxymethyl)p-cresol, 5.0 grams 3-mercaptopropionic acid and 1.5 grams p-toluenesulfonic acid monohydrate in 200 ml glacial acetic acid was reacted as described in Example 1

EXAMPLE 8

A Resin Formed From m-Cresol and 2,6 Bis (hydroxymethyl)-p-cresol

A 2-L four-neck resin kettle equipped with a stirrer, heating source, thermometer, variable reflux ratio distilling head and a nitrogen inlet tube was charged with 129.8 g m-cresol, 134.5 g 2,6-bis(hydroxymethyl)-p-cresol, 20 ml deionized water, 5.0 g oxalic acid dihydrate and 50 ml ethyl cellosolve acetate. The mixture was heated to about 60° C. at which point an exothermic condensation reaction ensued. The reaction was allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify.

EXAMPLE 9

A 2,5-Dimethylphenol—Bishydroxymethyl-p-cresol Resin

A mixture of 2,5-dimethylphenol (12.22 g, 0.1 mol), 2,6-bis(hydroxymethyl)-p-cresol (11.20 g, 0.0667 mol) and 95 ml of monomethyl ether of propylene glycol was charged into a 250 ml 2-necked round bottom flask equipped with a heating mantel, mechanical stirrer and reflux condenser. Concentrated hydrochloric acid (10 ml) was added and the mixture gently heated to reflux and kept at reflux for 5 hours. The solution was then cooled and dropwise added into about 1.8 L of deionized water to precipitate the polymer. The product was collected on a filter.

EXAMPLE 10

2,3-Dimethylphenol, 2-Methylresorcinol, Bishydroxymethyl-p-cresol Resin

A mixture of 2,3-dimethylphenol (7.33 g, 0.06 mol), 2,6-bis(hydroxymethyl)-p-cresol (11.37 g, 0.0677 mol), 2-methylresorcinol (3.25 g, 0.0262 mol) and 95 ml of monomethyl ether of propylene glycol was charged into a 250 ml 2-necked round bottom flask equipped with a heating mantel, mechanical stirrer and reflux condenser. Concentrated hydrochloric acid (10 ml) was added to the flask and the mixture gently heated to reflux and kept at reflux for 5 hours. The solution was then cooled and dropwise added into about 1.8 L of deionized water to precipitate the polymer. The product was collected on a filter.

EXAMPLE 11

A 4,4'-isopropylenebisphenol—Bishydroxymethyl-p-cresol Resin

A 1.0 L round-bottom flask equipped with a stirrer, condenser, thermometer and a gas inlet tube was charged with 50.0 g (0.22 mole) of 4,4'-isopropylenebisphenol, 36.8 g (0.22 mol) of bishydroxymethyl-p-cresol and 500 ml of 1,4-dioxane. The reaction mixture was saturated with anhydrous hydrochloric acid and allowed to stand at ambient temperature for about 15 hours. After a portion of the hydrochloric acid was expelled by heating to 95° C the reaction mixture was cooled and then slowly added to about 3.0 L of deionized water. The product layer was separated, washed with water and dried in a vacuum oven at 60° C. The product was then dissolved in 200 ml of acetone, precipitated into about 1.6 L of deionized water, collected on a filter and rinsed with water.

EXAMPLE 12

A Resin Formed From m-Cresol, 2,6-Bis (hydroxymethyl)-p-cresol and 1-Naphthol

A mixture comprised of 72.1 g 1-naphthol, 84.1 g 2,6-bis(hydroxymethyl)-p-cresol, 5.0 g oxalic acid dihydrate, and 150 ml ethyl cellosolve acetate in a 0.5-L resin kettle, equipped as in Example 30, was heated to initiate the condensation reaction substantially forming the 1-naphtholmethylene-p-cresol alternating copolymer. An exothermic reaction resulted, reaching a peak temperature of about 120° C. The reaction mixture was allowed to reflux for about 2 hours. 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 1.

EXAMPLE 13

An m-Cresol, Salicylaldehyde and 2,6-Bis (hydroxymethyl)-p-cresol Resin

A mixture of 146.0 g m-cresol, 25.2 g 2,6-bis (hydroxymethyl)-p-cresol, 5.0 g 3-mercaptopropionic acid and 1.5 g p-toluenesulfonic acid monohydrate in 200 ml glacial acetic acid were charged into a 1-L reaction vessel equipped with a paddle stirrer, reflux condenser and a nitrogen inlet tube. The mixture was heated to reflux and maintained at reflux to allow formation of the alternating copolymer. After 8 hours, 146.5 g salicylaldehyde were added over time to the reaction mixture to form alternating copolymer segments bonded with salicylaldehyde to form the block segments. Reflux was continued for 8 hours. The reaction mixture was slowly poured into 7 L deionized water to precipitate the resin. Once the solvent had exchanged with water, the product was collected on a filter, slurried once in warm deionized water for about 30 minutes, again collected and rinsed with water.

EXAMPLE 14

A m-Cresol, 2,3,5-Trimethylphenol Bishydroxymethyl-p-cresol, Formaldehyde Resin

To a 2 L resin kettle equipped with mechanical agitator, heating mantle, reflux condenser with a variable distillation head, thermometer and nitrogen inlet tube a mixture was added comprising 432.6 g of m-cresol, 148.6 g of 2,3,5-trimethylphenol, 463.3 g of bishydroxymethyl-p-cresol, 180 g of propyleneglycol methyl ether acetate, 36 g of water and 9.1 g of oxalic acid dihydrate. The mixture was heated to reflux and 127.9 g of 37.2% formaldehyde was added over a 25 minute period. After 3 hours of reflux, the amount of heat was increased to remove the water and solvent by distillation. Partial vacuum was applied at about 215° C. and gradually increased to 0.9 mm Hg to remove the unreacted monomers. Once the batch temperature again reached 215° C. the resin was poured from the reaction kettle and allowed to cool.

EXAMPLE 15

Conventional Novolak Resin

A 2 L four-necked resin kettle equipped with a stirrer, heating mantel, thermometer, water cooled condenser and nitrogen inlet/outlet ports was charged with 278.3 g (99%) m-cresol, 335.5 g (99%) p-cresol, 34.3 g (99%) o-cresol, 68.3 g of formalin, 20 g deionized water and 12.0 g of oxalic acid dihydrate. The mixture was gently heated to reflux and while at reflux 273.3 g of the formalin was added in about one hour. The reaction was then allowed to continue for about four hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mmHg was achieved. The vacuum was interrupted with nitrogen and the resin melt poured into a tray and cooled under nitrogen.

In accordance with the invention, phenolic resin produced by the methods of the above examples have impurities, especially acid residues, removed by liquid-liquid extraction. This involves dissolution of the resin in an essentially aqueous insoluble solvent followed by extraction with water. The term essentially aqueous insoluble solvent means an organic solvent having a solubility in water less than five percent by weight and preferably less than two percent by weight.

In the first step of the process, the resin is dissolved in the aqueous insoluble solvent. Preferably, the resin is in the form of a wet filter cake recovered from its reaction solution by precipitation in water. However, in alternative embodiments of the invention, the water insoluble solvent may be added as an additional solvent to the reaction mixture or may be added to a solvent in which the resin from its reaction mixture is recovered. The concentration of the resin in solvent is desirably high. Preferably, the concentration of resin dissolved in the organic solvent is at least 20 percent by weight, more preferably at least 30 percent by weight and most preferably, from 40 percent by weight to its solubility limit.

Suitable solvents are those that are solvents for the resin, insoluble in water as defined above and readily separated from water when mixed with the same. In one embodiment of the invention, the solvent is also a solvent that may be used in a photoresist coating composition either as a component of a solvent system or as the primary solvent for the coating composition. Suitable solvents include amyl acetate, butyl acetate, ethyl acetate, methyl isobutyl ketone and methyl tert-butyl ether. Where the solvent is one used in the final photoresist composition, following liquid-liquid extraction, the solution may be diluted with the same or additional solvents for make-up of the photoresist coating composition. If the solvent is unsuitable for use as a photoresist solvent, the solvent is stripped from the resin such as by vacuum distillation. A desirable method to remove the solvent is to dilute the solution with a photoresist solvent and then vacuum distill the unwanted solvent from solution. With regard to the above solvents, dilution is preferably accomplished by addition of a solvent such as ethyl lactate, propylene glycol monomethyl ether or ether acetate, cellosolve acetate, etc. to make the final coating composition having desirable coating properties.

Liquid-liquid extraction is accomplished by mixing the resin solution with an aqueous phase preferably formed from distilled, deionized water. The ratio of the resin solution phase to the aqueous extraction phase may vary within relatively large limits, for example, from 10 parts resin solution to 1 part aqueous phase to 1 part resin solution to 50 parts aqueous phase. Preferably, the ratio varies from 2 parts resin solution to 1 part aqueous phase to 5 parts aqueous phase to 1 part resin solution. Following admixture of the two phases, an unstable heterogeneous dispersion of the two phases is formed using mixing methods known to the art such as ultrasonics, high speed agitation, vibration, shaking, etc. Mixing is continued for a time sufficient to extract impurities from the organic phase into the aqueous phase. This may take from 1 minute to 24 hours and typically is conducted for a period of from 5 minutes to 2 hours. Following this period of time, the dispersion is permitted to separate back into two phases which are then separated from each other. The extraction may be repeated several times to reduce the impurity level to a desired acceptable level.

The above procedure typically is capable of removing acid and halide impurities to level of less than 20 and often less than 10 parts per million parts of solution. Metal ion contaminants are removed by the process as well. Typically, the metal ion concentration is reduced to less than 100 parts per billion parts of solution and often to level of less than 20 parts per billion parts of solution.

The following example illustrates extraction procedures in accordance with the invention.

EXAMPLE 16

In this example, a resin formed using the reactants and procedures of Example 6 was treated in accordance with the liquid-liquid extraction process of the invention. A glass, 2 liter resin kettle was washed with n-butyl acetate and fitted with an overhead stirrer and thermometer. The cleaned kettle was filled with 750 grams of n-butyl acetate. Temperature control was provided by a constant temperature water bath set at 50° C. A wet cake weighing 750 grams formed by precipitation of a resin prepared in accordance with the procedures of Example 6 was added to the stirred n-butyl acetate in the kettle. The wet cake comprised 25 % resin and 75 % water. The solution of the resin had 500 grams of deionized water added to it. The mixture was stirred vigorously for 15 minutes. The mixture separated into two phases after standing without stirring for 45 minutes. A bottom phase formed which was removed from the kettle using a stainless steel needle encased in teflon tubing and vacuum supplied by a water aspirator. The organic resin solution was then analyzed for chloride and iron content. The results are set forth in the following table.

|  | Chloride, PPM | Iron, PPB |
| --- | --- | --- |
| Dry Resin | 324 | 89 |
| Washed Resin | <3 | <10 |

Chloride ion was determined by titration and iron was measured by Flameless Atomic Absorption Spectroscopy.

The temperature of the water bath was lowered to 30° C. and 650 grams of deionized water were added to the resin solution recovered by the above procedure. The mixture was stirred vigorously for 15 minutes and permitted to separate into two phases after standing without stirring for 90 minutes. A sample weighing 713 grams of the bottom aqueous phase was removed from the kettle using procedures described above. Again, the organic solution was analyzed for chloride and iron content. The results were identical to the results obtained after the first wash indicating that further washing was unnecessary.

EXAMPLE 17

A wet cake of a resin formed according to the procedure of Example 6 was dissolved in amyl acetate and extracted with water using the procedures of Example 16. After the first liquid-liquid extraction, the organic solution was analyzed for chloride and iron content. The results are summarized in the following Table:

|  | Chloride, PPM | Iron, PPB |
| --- | --- | --- |
| Dry Resin | 350 | 188 |
| Washed Resin | <35 | <25 |

EXAMPLE 18

The process of Example 16 was generally repeated except that methyl tert-butyl ether was used as the organic solvent. Upon reducing the ionic contaminants to a level acceptable for use of the resin in a high performance photoresist, ethyl lactate was added to the resin solution in an amount equivalent to about 35 to 44% solids calculated on the basis of no methyl tert-butyl ether being present in the solution. A partial vacuum (about 250 to 20 mm Hg) was applied to the vessel while the solution was heated to about 50° to 70° C. to distill the butyl ether from the solution. Upon removal of the methyl tert-butyl ether to less than 0.2% as determined by gas chromatography, ethyl lactate was added to adjust the resin concentration to about 35 to 38% solids. The solution so formed is ready for conversion to a final resist composition. The ion contamination analysis results are shown in the following table:

|  | Cl, ppm | Fe, ppb | Na, ppb | Ca, ppb | Mg, ppb |
| --- | --- | --- | --- | --- | --- |
| Dry Resin | 301 | 991 | 162 | 509 | 65 |
| Washed Resin | <3 | 18 | 30 | 11 | 2 |

We claim:

1. A process for preparing an organic photoresist coating composition comprising an organic solvent solution of a thermoplastic phenolic resin and a photoactive system, said process including the steps of forming a crude phenolic resin, dissolving said crude phenolic resin in an aqueous insoluble organic solvent in which the resin and photoactive system are soluble, admixing said organic resin solution with an aqueous phase to extract water soluble impurities from the resin solution into the aqueous phase with the resin remaining dissolved in solution, and diluting said organic resin solution with additional solvent that is a solvent for the photoresist coating composition.

2. The process of claim 1 including the steps of separating the crude thermoplastic phenolic resin from its reaction mixture by precipitating the resin in water, collecting the precipitate as a wet filter cake and dissolving the wet filter cake in said aqueous insoluble organic solvent, each of said steps being performed prior to the step of extraction of impurities into an aqueous phase.

3. The process of claim 1 including the steps of adding the aqueous insoluble organic solvent to the phenolic resin reaction mixture to form a solution of the resin dissolved in the aqueous insoluble organic solvent and admixing said solution with an aqueous phase to extract water soluble impurities from the resin solution into the aqueous phase.

4. The process of claim 1 including the steps of separating the crude thermoplastic phenolic resin from its reaction mixture by precipitating the resin in a non-solvent for the resin, collecting the precipitate and dissolving the precipitate in said aqueous insoluble organic solvent.

5. The process of claim 1 where the resin concentration in the aqueous insoluble organic solvent is at least 20 percent by weight.

6. The process of claim 5 where the concentration is at least 40 percent by weight.

7. The process of claim 1 where the resin is an aromatic resin.

8. The process of claim 1 where the aqueous insoluble solvent is an alkyl acetate or an ether.

9. The process of claim 8 where the aqueous insoluble solvent is n-butyl acetate.

10. The process of claim 1 where the additional solvent is ethyl lactate.

11. The process of claim 1 including the step of removing the aqueous insoluble resin from the aqueous insoluble organic solvent by distillation following the step of extraction.

\* \* \* \* \*